(12) United States Patent
Cheng et al.

(10) Patent No.: US 8,604,846 B2
(45) Date of Patent: Dec. 10, 2013

(54) RESETTING CIRCUIT

(75) Inventors: Hsiao-Chung Cheng, Hsin-Chu (TW);
Cheng-Han Huang, Hsin-Chu (TW);
Meng-Sheng Chang, Hsin-Chu (TW)

(73) Assignee: AU Optronics Corp., Hsinchu (TW)

( * ) Notice: Subject to any disclaimer, the term of this patent is extended or adjusted under 35 U.S.C. 154(b) by 47 days.

(21) Appl. No.: 13/295,270

(22) Filed: Nov. 14, 2011

(65) Prior Publication Data

US 2012/0169386 A1 Jul. 5, 2012

(30) Foreign Application Priority Data

Dec. 30, 2010 (TW) ................................ 99147034 A
Aug. 5, 2011 (TW) ................................ 100128035 A

(51) Int. Cl.
*H03L 7/00* (2006.01)

(52) U.S. Cl.
USPC ............................ 327/142; 327/143; 327/198

(58) Field of Classification Search
USPC ........................................ 327/142, 143, 198
See application file for complete search history.

(56) References Cited

U.S. PATENT DOCUMENTS 5,309,037 A * 5/1994 Curley et al. ................. 327/142
6,862,013 B2 3/2005 Takeuchi et al.
7,319,452 B2 1/2008 Moon
7,369,111 B2 5/2008 Jeon et al.
7,847,778 B2 12/2010 Chien et al.
2004/0041774 A1 3/2004 Moon
2007/0029082 A1 2/2007 Giroux et al.
2007/0057899 A1 * 3/2007 Yamashita ..................... 345/100
2007/0171172 A1 7/2007 Chang et al.
2009/0135991 A1 * 5/2009 Chen ............................... 377/79
2012/0127068 A1 * 5/2012 Otose .............................. 345/98

FOREIGN PATENT DOCUMENTS

CN 101567219 A 10/2009

OTHER PUBLICATIONS

China Patent Office, Office Action issued on May 2, 2013.

* cited by examiner

*Primary Examiner* — Lincoln Donovan
*Assistant Examiner* — Brandon S Cole
(74) *Attorney, Agent, or Firm* — WPAT, PC; Justin King

(57) ABSTRACT

An exemplary resetting circuit adapted for regulating a voltage on an output terminal of a shift register is disclosed. The resetting circuit includes a reset driving module and a reset module. The reset driving module is received with an enable signal to output a control voltage signal to an output terminal of the reset driving module. The reset module is electrically coupled to the output terminal of the shift register and the output terminal of the reset circuit driving module, and is controlled by the control voltage signal on the output terminal of the reset driving module to determine whether switching on an electrical path between the output terminal of the shift register and a gate-off voltage level.

14 Claims, 10 Drawing Sheets

US 8,604,846 B2

RESETTING CIRCUIT

TECHNICAL FIELD

The disclosure relates to display technologies, and more particularly to a resetting circuit adapted for regulating a voltage on an output terminal of a shift register.

BACKGROUND

With the development of science and technology, flat panel display devices e.g., liquid crystal display devices have many advantages of high display quality, small volume, light weight and wide application range and thus are widely used in consumer electronics products such as mobile phones, laptop computers, desktop computers and televisions, etc. Moreover, the flat panel display devices have evolved into a mainstream display devices in place of cathode ray tube (CRT) display devices.

In order to reduce the cost of flat panel display device, gate-on array (abbreviated as GOA) driving and half-source driving (abbreviated as HSD) technologies have been proposed. It is well-known that, the GOA driving circuit is directly manufactured on a display panel like the manufacture of pixels; and in a display panel with HSD structure, pixels electrically coupled to a same data line would be arranged two sides of the data line e.g., in zigzag manner. Generally, the conventional GOA driving circuit includes multiple shift registers connected in cascade for sequentially outputting multiple gate driving pulses, and FIG. 1 illustrates a single stage shift register SR(n) in the cascade-connected shift registers. In particular, the shift register SR(n) includes transistors T11, T12, T21 and a pull-down circuit 100. The drain/source of the transistor T12 receives a clock signal CK(n−1), and the gate of the transistor T12 receives a control signal Q(n−1) to determine whether allowing the clock signal CK(n−1) to be delivered to the source/drain of the transistor T12. The drain/source and the gate of the transistor T11 both are electrically coupled to the source/drain of the transistor T12 to deliver the clock signal CK(n−1) to an node Q. The gate of the transistor T21 is electrically coupled to the node Q and on-off states of the transistor T21 are controlled by a control signal Q(n) on the node Q, the drain/source of the transistor T21 receives another clock signal CK(n), and the source/drain of the transistor T21 serves as an output terminal of the shift register SR(n) to output a gate driving pulse G(n) according to the received clock signal CK(n). Herein, Q(n−1) is the control signal on the node Q in the firstly-preceding (i.e., the nearest-preceding) stage shift register SR(n−1) (not shown). The pull-down circuit 100 is electrically coupled between the node Q and a gate-off voltage level Vss, and further electrically coupled to the source/drain of the transistor T21 to pull the gate driving pulse G(n) down to the gate-off voltage level Vss in a particular time duration.

FIG. 2 shows a timing diagram of multiple signals associated with the shift register SR(n) of FIG. 1, and an operation principle of the shift register SR(n) will be described below in detail with reference to FIGS. 1 and 2. Specifically, during the shift register SR(n) outputs the gate driving pulse G(n), the transistors T31, T32, T41, T42 in the pull-down circuit 100 are turned off. Whereas, during the shift register SR(n) stops outputting the gate driving pulse G(n), the voltage level of the gate driving pulse G(n) is pulled down to the gate-off voltage level Vss by the control signal Q(n) in the time duration of t.

However, when a manufacturing process variation of the transistors T41, T42 in the pull-down circuit 100 is excessively large, the control signal Q(n) in the time duration of t would be leaked to the gate-off voltage level Vss in advance rather than changes along the dashed line in the time duration of t in FIG. 2, so that the gate driving pulse G(n) would not be normally turned off and occurs a tail phenomenon (see the waveform of the G(n) in the time duration of t as illustrated in FIG. 2). If the tail is excessively long, pixels for displaying an image would be wrongly charged, resulting in abnormal image display.

SUMMARY

Accordingly, a resetting circuit in accordance with an exemplary embodiment of the disclosure is adapted to regulate a voltage on an output terminal of a shift register and includes a reset driving module and a reset module. The reset driving module is received with an enable signal to output a control voltage signal to an output terminal of the reset driving module. The reset module is electrically coupled to the output terminal of the shift register and the output terminal of the reset driving module, and is controlled by the control voltage signal on the output terminal of the reset driving module resulting from the enable signal to determine whether switching on an electrical path between the output terminal of the shift register and a first preset voltage (e.g., gate-off voltage level).

A resetting circuit in accordance with another exemplary embodiment of the disclosure is adapted to regulate a voltage on an output terminal of a shift register and includes a reset driving module and a reset module. The reset driving module is controlled by a reset control signal to determine whether providing an enable signal to an output terminal of the reset driving module. The reset module is electrically coupled to the output terminal of the shift register and the output terminal of the reset driving module and is controlled by a voltage signal on the output terminal of the reset driving circuit resulting from the enable signal to determine whether switching on an electrical path between the output terminal of the shift register and a gate-off voltage level.

BRIEF DESCRIPTION OF THE DRAWINGS

The above embodiments of the disclosure will become more readily apparent to those ordinarily skilled in the art after reviewing the following detailed description and accompanying drawings.

DETAILED DESCRIPTION OF EMBODIMENTS

The disclosure will now be described more specifically with reference to the following embodiments. It is to be noted that the following descriptions of embodiments are presented herein for purpose of illustration and description only. It is not intended to be exhaustive or to be limited to the precise form disclosed.

First Embodiment

Figure 1:
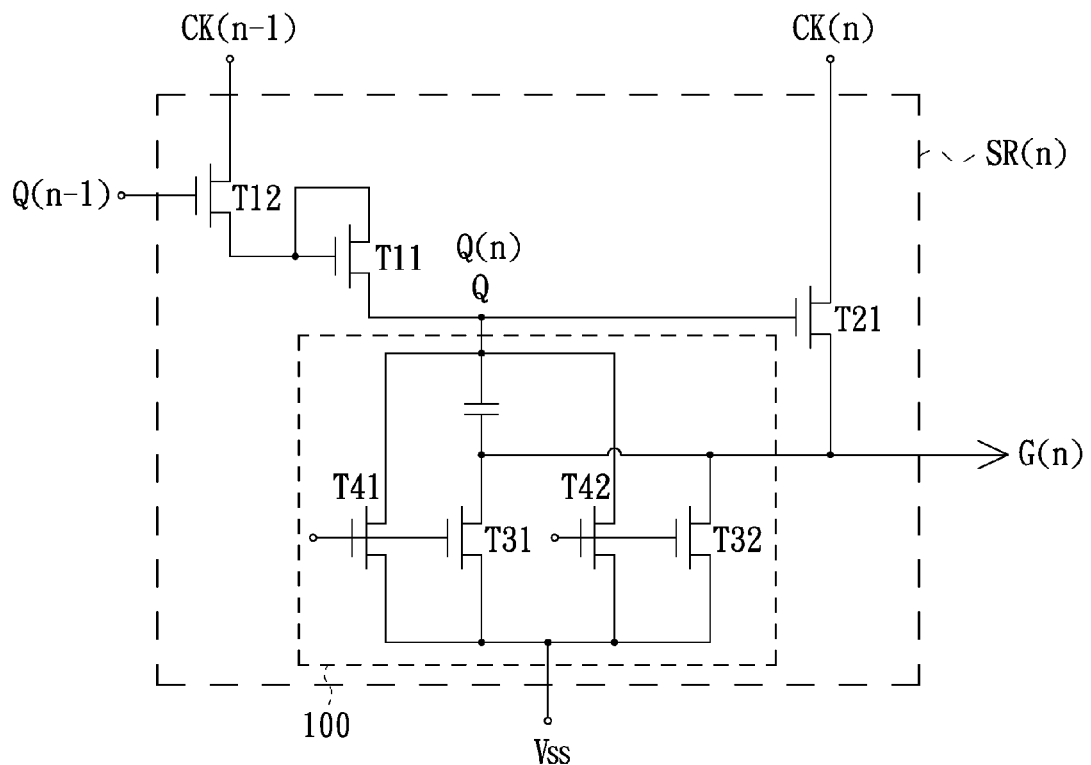
FIG. 1 is a schematic circuit structure view of a single stage shift register of multiple cascade-connected shift registers.
Figure 2:
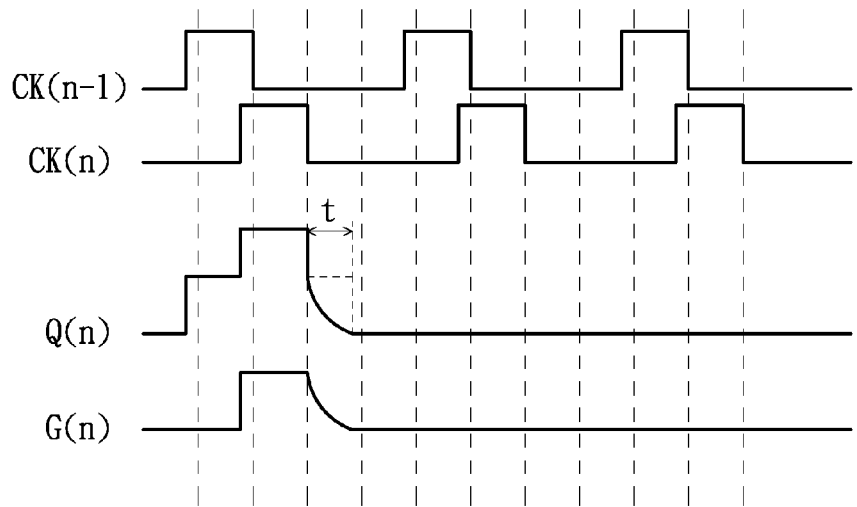
FIG. 2 is a timing diagram of multiple signals associated with the single stage shift register of FIG. 1.
Figure 3A:
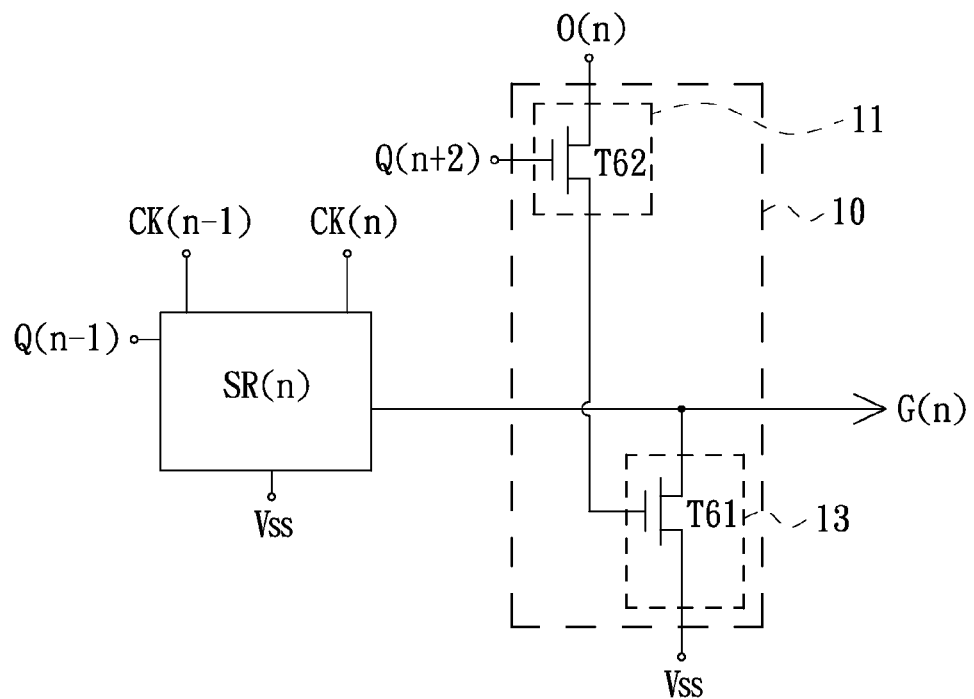
FIG. 3A is schematic structure view of a resetting circuit in accordance with a first embodiment.

Referring to FIG. 3A, a schematic structure view of a resetting circuit in accordance with a first embodiment is shown. As depicted in FIG. 3A, the resetting circuit 10 is electrically coupled to an output terminal of a shift register SR(n) to regulate a voltage (i.e., generally a gate driving pulse) on the output terminal of the shift register SR(n). In the exemplary embodiment, the output terminal of the shift register SR(n) is for outputting a gate driving pulse G(n), the shift register SR(n) of FIG. 3A may have the same structure as the shift register SR(n) of FIG. 1, but not to limit the disclosure, that is, the resetting circuit 10 mat be applied to any other well-known shift register. In addition, it is noted that, the resetting circuit 10 in FIG. 3A is arranged outside of the shift register SR(n), which only is for the purpose of emphasizing the difference of the disclosure with respect to the prior art, but not to limit the shift register SR(n) whether includes the resetting circuit 10 therein or not.

In the first embodiment, the shift register SR(n) is an odd-stage shift register of multiple cascade-connected shift registers for sequentially outputting multiple gate driving pulses. The odd-stage shift register SR(n) receives clock signals CK(n−1), CK(n) and a control signal Q(n−1) and is controlled by the control signal Q(n−1) cooperative with the clock signal CK(n−1) to determine whether delivering the clock signal CK(n) to the output terminal of the odd-stage shift register SR(n) to generate the gate driving pulse G(n). Herein, the control signal Q(n−1) is a signal on the node Q (see FIG. 1) in the firstly-preceding shift register SR(n−1) (not shown). The resetting circuit 10 is electrically coupled to the output terminal of the odd-stage shift register SR(n) and includes a reset driving module 11 and a reset module 13.

More specifically, the reset driving module 11 receives an enable signal O(n) and provides the enable signal O(n) to an output terminal of the reset driving module 11 under the control of a reset control signal Q(n+2). For example, the reset driving module 11 includes a transistor T62. The gate (control terminal) of the transistor T62 receives the reset control signal Q(n+2) and is controlled by the reset control signal Q(n+2) to determine whether turning on the transistor T62, the drain/source (first terminal) of the transistor T62 receives the enable signal O(n), and the source/drain (second terminal) of the transistor T62 serves as the output terminal of the reset driving module 11. It is understood that, the reset control signal Q(n+2) is a signal in the firstly-succeeding odd-stage shift register SR(n+2) (not shown) for controlling a received clock signal whether to be delivered to the output terminal of the firstly-succeeding odd-stage shift register SR(n+2), i.e., generally a signal on the node Q in the firstly-succeeding odd-stage shift register SR(n+2).

Figure 3B:
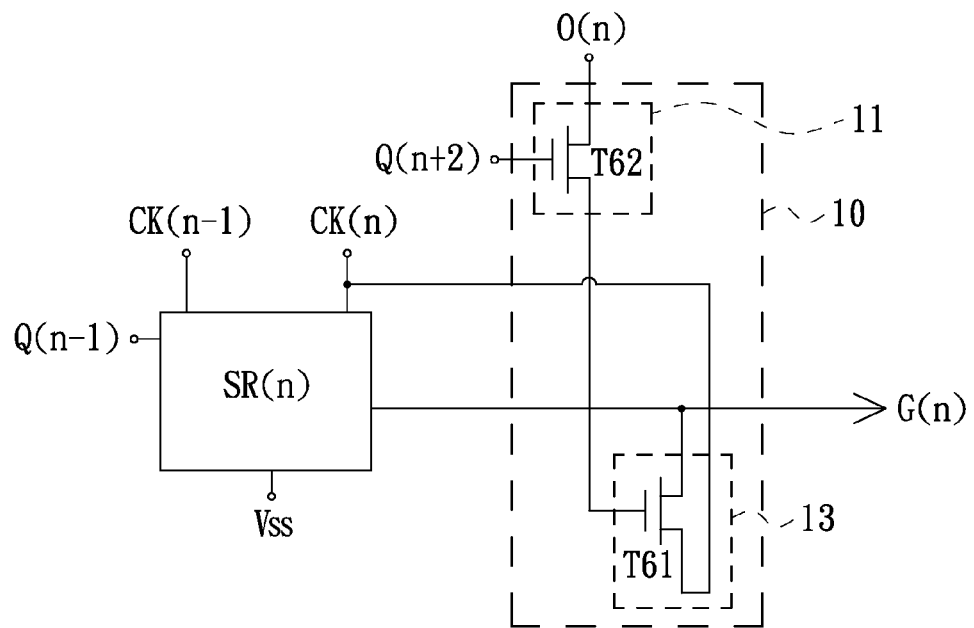
FIG. 3B is a schematic structure view of another resetting circuit in accordance with the first embodiment.

The reset module 13 is electrically coupled to the output terminal of the odd-stage shift register SR(n) and the output terminal of the reset driving module 11 and is controlled by a voltage signal on the output terminal of the reset driving module 11 resulting from the enable signal O(n) to determine whether switching on an electrical path between the output terminal of the odd-stage shift register SR(n) and a gate-off voltage level Vss. Specifically, the reset module 13 includes a transistor T61, the gate (control terminal) of the transistor T61 is electrically coupled to the source/drain of the transistor T62 and is controlled by a voltage signal on the source/drain of the transistor T62 to determine whether turning on the transistor T61, the drain/source (first terminal) of the transistor T61 is electrically coupled to the output terminal of the odd-stage shift register SR(n), and the source/drain (second terminal) of the transistor T61 is electrically coupled to the gate-off voltage level Vss (first preset voltage). Herein, it is noted that, the source/drain of the transistor T61 is not limited to electrically couple to the gate-off voltage level Vss, and can be electrically coupled to the clock signal CK(n) as illustrated in FIG. 3B instead e.g., for obtaining the logic low level of the CK(n) delivered in the odd-stage shift register SR(n) as such gate-off voltage level.

Figure 4:
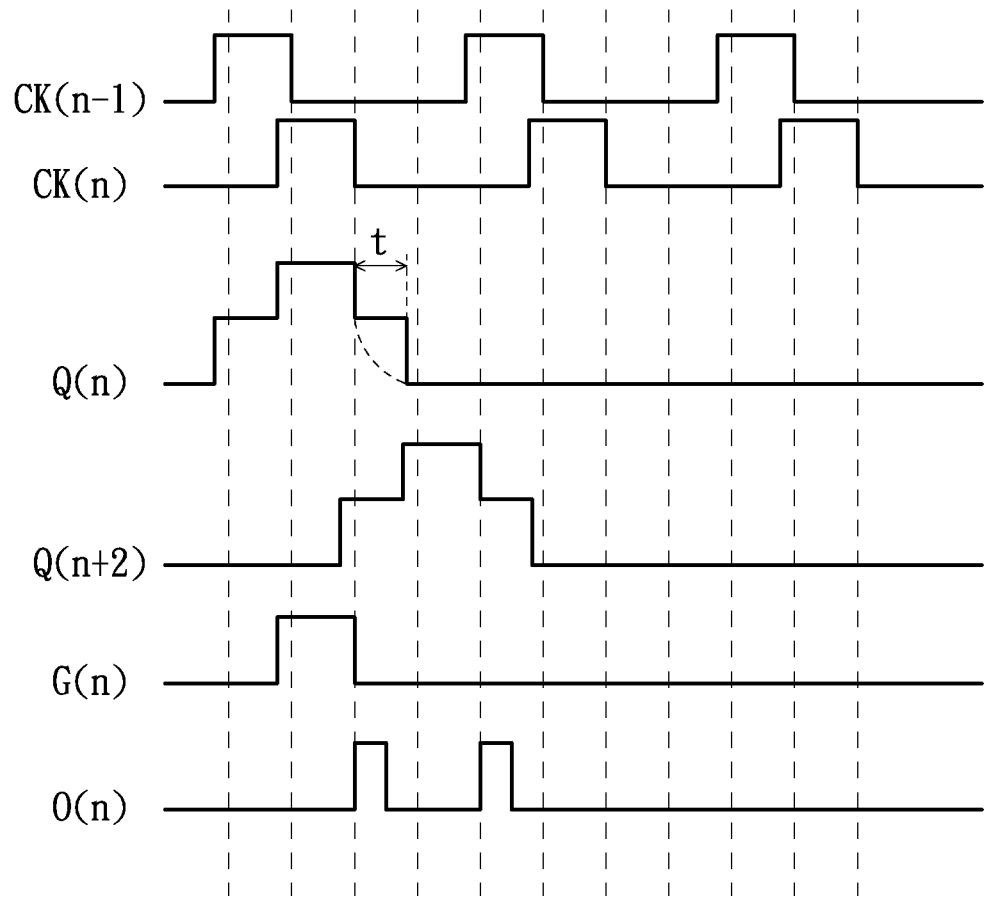
FIG. 4 is a timing diagram of multiple signals associated with an odd-stage shift register and the resetting circuit of FIG. 3A.

FIG. 4 shows a timing diagram of multiple signals associated with the odd-stage shift register SR(n) and the resetting circuit 10 as depicted in FIG. 3A, and an operation process of the resetting circuit 10 will be described below in detail with reference to FIGS. 3A and 4. In particular, when the clock signal CK(n) and the control signal Q(n) are at logic high levels, the clock signal CK(n) is delivered to the output terminal of the odd-stage shift register SR(n) to generate the gate driving signal G(n), meanwhile the control signal Q(n) further is pulled up by capacitive coupling effect. Just after the falling edge of the clock signal CK(n), the voltage level of the control signal Q(n) (see Q(n) in the time duration of t as illustrated in FIG. 4) correspondingly is pulled down. At this moment, since the reset control signal Q(n+2) is at a logic high level, the transistor T62 in the reset driving module 11 is turned on, a logic high level of the enable signal O(n) is delivered to the gate of the transistor T61 in the reset module 13 through the turned on transistor T62, so that the transistor T61 is turned on, the voltage on the output terminal of the odd-stage shift register SR(n) is quickly pulled down to the gate-off voltage level Vss. Accordingly, even if the control signal Q(n) in the odd-stage shift register SR(n) is leaked to the gate-off voltage level Vss in advance caused by the manufacturing process variation, the gate driving pulse G(n) still can be normally pulled to the gate-off voltage level Vss owing to the resetting effect of the resetting circuit 10 and the tail phenomenon of gate driving pulse is suppressed. In actual applications, when the shift register SR(n) is applied to a display device, the timing of the enable signal O(n) can be controlled by a timing controller in the display device, and the enable signal O(n) starts to output a logic high level just after the falling edge of the clock signal CK(n) received by the odd-stage shift register SR(n). Moreover, the time of the enable signal O(n) starting to output the logic high level can be adjusted by programming, and rather than only is limited to start just after the falling edge of the clock signal CK(n).

Second Embodiment

Figure 5A:
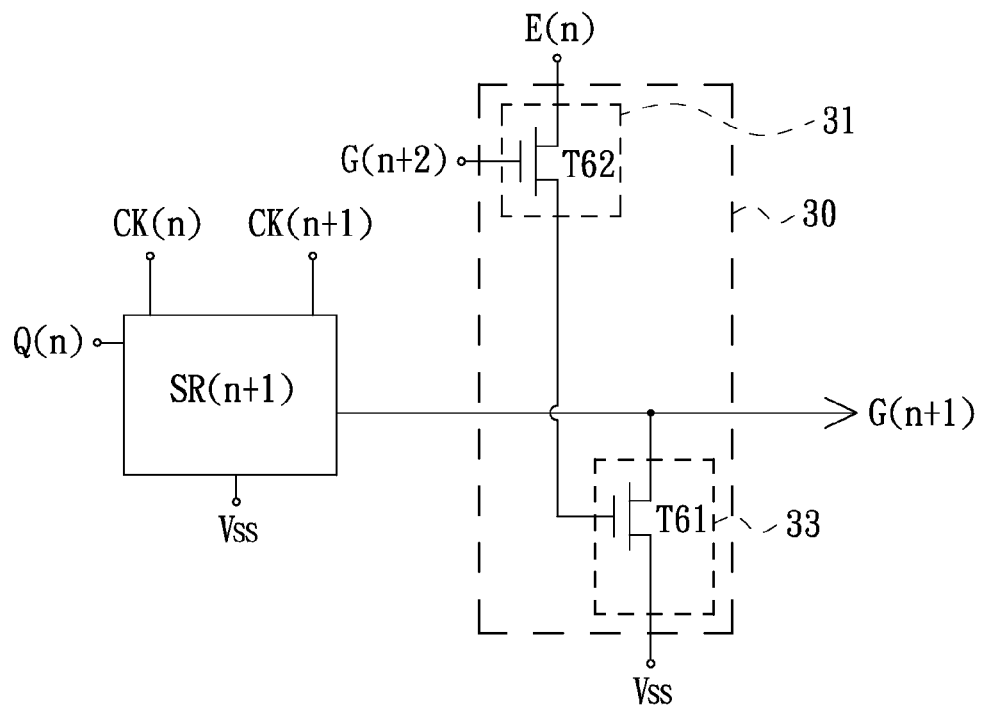
FIG. 5A is a schematic structure view of a resetting circuit in accordance with a second embodiment.

Referring to FIG. 5A, a schematic structure view of a resetting circuit in accordance with a second embodiment is shown. As depicted in FIG. 5A, the resetting circuit 30 is electrically coupled to an output terminal of the shift register SR(n+1) to regulate a voltage on the output terminal of the shift register SR(n+1). The shift register SR(n+1) of FIG. 5A may have the same structure as the shift register SR(n) of FIG. 1, but not to limit the disclosure, that is, the resetting circuit 30 may be applied to any other well-known shift register. In addition, it is noted that, the resetting circuit 30 is arranged outside the shift register SR(n+1), which only is for the purpose of emphasizing the difference of the disclosure with respect to the prior art, but not to limit the shift register SR(n+1) whether includes the resetting circuit 30 therein or not.

In the second embodiment, the shift register SR(n+1) is an even-stage shift register of multiple cascade-connected shift registers for sequentially outputting multiple gate driving pulses. The even-stage shift register SR(n+1) receives clock signals CK(n), CK(n+1) and a control signal Q(n) and is controlled by the control signal Q(n) cooperative with the clock signal CK(n) to determine whether delivering the clock signal CK(n+1) to the output terminal of the even-stage shift register SR(n+1) to generate a gate driving pulse G(n+1). The resetting circuit 30 is electrically coupled to the output terminal of the even-stage shift register SR(n+1) and includes a reset driving module 31 and a reset module 33.

In particular, the reset driving module 31 receives an enable signal E(n) and provides the enable signal E(n) to an output terminal of the reset driving module 31 subjected to the control of a reset control signal G(n+2). In the exemplary embodiment, the reset driving module 31 includes a transistor T62. The gate (control terminal) of the transistor T62 receives the reset control signal G(n+2) and is controlled by the reset control signal G(n+2) to determine whether turning on the transistor T62, the drain/source (first terminal) of the transistor T62 receives the enable signal E(n), and the source/drain (second terminal) of the transistor T62 serves as the output terminal of the reset driving module 31. It is understood that, the reset control signal G(n+2) is a gate driving pulse outputted from an output terminal of the firstly-succeeding stage shift register SR(n+2) (not shown).

Figure 5B:
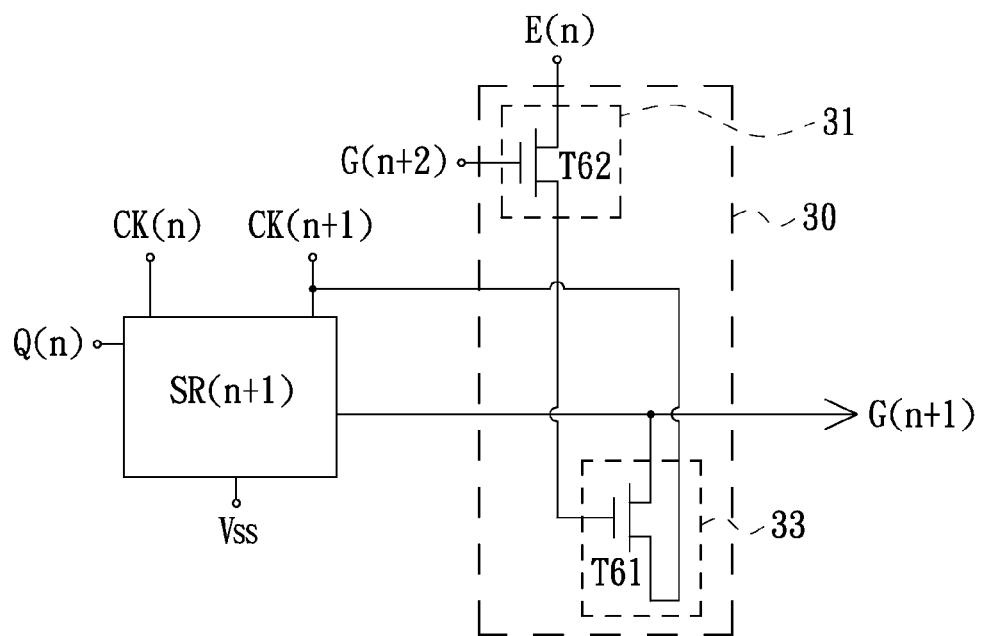
FIG. 5B is a schematic structure view of another resetting circuit in accordance with the second embodiment.

The reset module 33 is electrically coupled to the output terminal of the even-stage shift register SR(n+1) and the output terminal of the reset driving module 31 and is controlled by a voltage signal on the output terminal of the reset driving module 31 to determine whether switching on an electrical path between the output terminal of the even-stage shift register SR(n+1) and a gate-off voltage level Vss. The reset module 33 includes a transistor T61. The gate (control terminal) of the transistor T61 is electrically coupled to the source/drain of the transistor T62 and is controlled by the voltage on the source/drain of the transistor T62 to determine whether turning on the transistor T61, the drain/source (first terminal) of the transistor T61 is electrically coupled to the output terminal of the even-stage shift register SR(n+1), and the source/drain (second terminal) of the transistor T61 is electrically coupled to the gate-off voltage level Vss (first preset voltage). Herein, it is noted that, the source/drain of the transistor T1 is not limited to electrically couple to the gate-off voltage level Vss, and may be electrically coupled to the clock signal CK(n+1) instead as illustrated in FIG. 5B e.g., for obtaining the logic low level of the CK(n+1) delivered in the even-stage shift register SR(n+1) as such gate-off voltage level.

Figure 6:
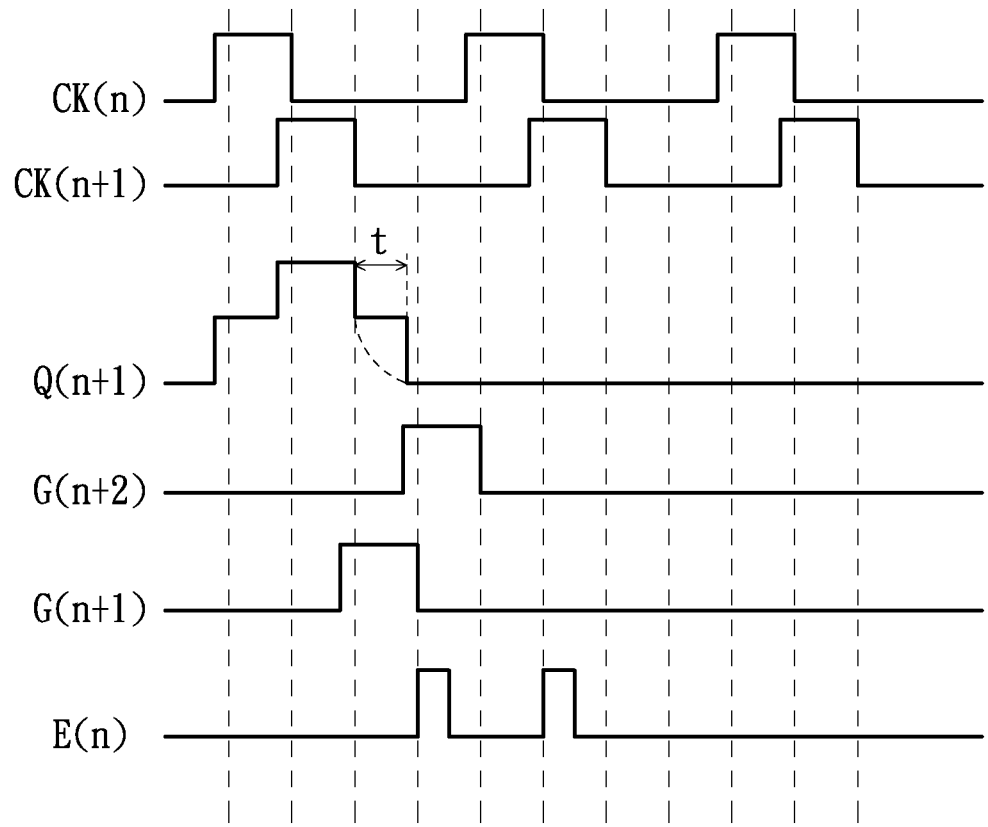
FIG. 6 is a timing diagram of multiple signals associated with an even-stage shift register and the resetting circuit of FIG. 5A.

FIG. 6 shows a timing diagram of multiple signals associated with the even-stage shift register SR(n+1) and the resetting circuit 30 as illustrated in FIG. 5A, and an operating process of the resetting circuit 30 will be described below in detail with reference to FIGS. 5A and 6. Specifically, when the clock signal CK(n+1) and the control signal Q(n+1) are at logic high levels, the clock signal CK(n+1) would be delivered to the output terminal of the even-stage shift register SR(n+1) to generate the gate driving pulse G(n+1), and meanwhile the control signal Q(n+1) is further pulled up. Just after the falling edge of the clock signal CK(n+1), the voltage level of the control signal Q(n+1) (see Q(n+1) in the time duration of t as illustrated in FIG. 6) is correspondingly pulled down. At this moment, since the reset control signal G(n+2) is at a logic high level, the transistor T62 in the reset driving module 31 is turned on, a logic high level of the enable signal E(n) is delivered to the gate of the transistor T61 in the reset module 33, so that the transistor T61 is turned on, the voltage on the output terminal of the even-stage shift register SR(n+1) is instantly pulled down to the gate-off voltage level Vss. Accordingly, even if the control signal Q(n+1) in the even-stage shift register SR(n+1) is leaked to the gate-off voltage level Vss in advance caused by the manufacturing process variation, the gate driving pulse G(n+1) still can be normally pulled to the gate-off voltage level Vss owing to the resetting effect of the resetting circuit 30 and the tail phenomenon of gate driving pulse is suppressed. In actual applications, when the shift register SR(n+1) is applied to a display device, the timing of the enable signal E(n) can be controlled by a timing controller in the display device, and the enable signal E(n) starts to output a logic high level just after the falling edge of the clock signal CK(n+1) received by the even-stage shift register SR(n+1). Moreover, the time of the enable signal E(n) staring to output the logic high level can be adjusted by programming, and rather than only is limited to start just after the falling edge of the clock signal CK(n+1).

Third Embodiment

Figure 7:
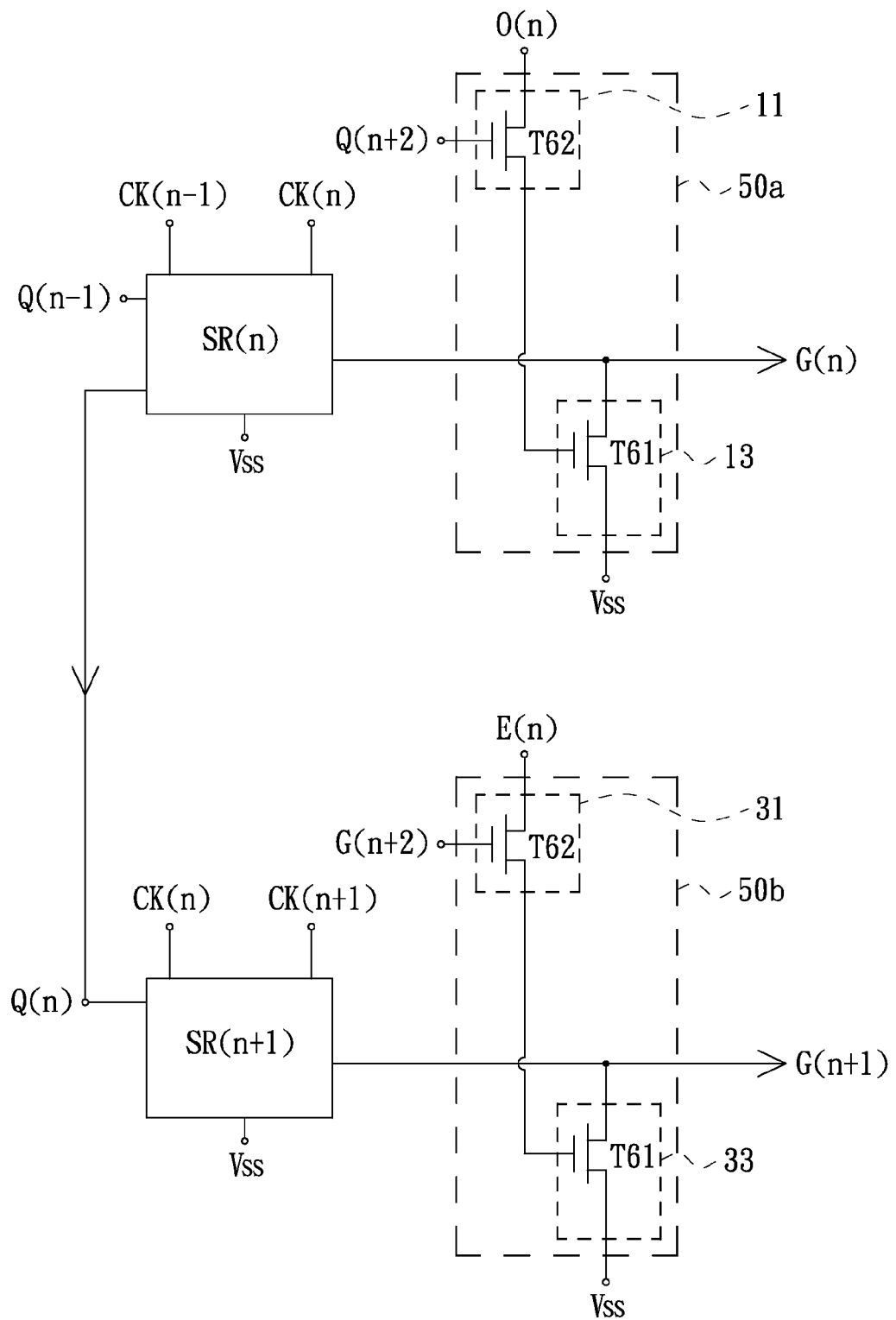
FIG. 7 is a schematic structure view of resetting circuits for adjacent two shift registers in accordance with a third embodiment.

Referring to FIG. 7, a schematic structure view of resetting circuits respectively for adjacent two shift registers in accordance with a third embodiment is shown. As depicted in FIG. 7, an odd-stage shift register SR(n) and an even-stage shift register SR(n+1) adjacent thereto are taken as an example for the purpose of illustration. In particular, the odd-stage shift register SR(n) receives clock signal CK(n−1), CK(n) and a control signal Q(n−1) and is controlled by the control signal Q(n−1) cooperative with the clock signal CK(n−1) to determine whether delivering the clock signal CK(n) to the output terminal of the odd-stage shift register SR(n) to generate a gate driving pulse G(n). The resetting circuit 50a electrically coupled to the output terminal of the odd-stage shift register SR(n) is the same as the resetting circuit 10 of FIG. 3A that uses the control signal Q(n+2) on the node Q in the firstly-succeeding odd-stage shift register SR(n+2) (not shown) as reset control signal, and thus the circuit structure thereof herein will not be repeated. In another aspect, the even-stage shift register SR(n+1) receives clock signals CK(n), CK(n+1) and a control signal Q(n) and is controlled by the control signal Q(n) cooperative with the clock signal CK(n) to determine whether delivering the clock signal CK(n+1) to an output terminal of the even-stage shift register SR(n+1) to generate a gate driving pulse G(n+1). The resetting circuit 50b electrically coupled to the output terminal of the even-stage shift register SR(n+1) is the same as the resetting circuit 30 of FIG. 5A that uses the gate driving pulse outputted from the firstly-succeeding stage shift register as the reset control signal, and thus the circuit structure thereof herein will not be repeated In short, in the third embodiment, the reset control signal Q(n+2) used by the resetting circuit 50a for the odd-stage shift register SR(n) is different from the reset control signal G(n+2) used by the resetting circuit 50b for the even-stage shift register SR(n+1), one is a control signal on the node Q while the other one is a gate driving pulse.

Fourth Embodiment

Figure 8A:
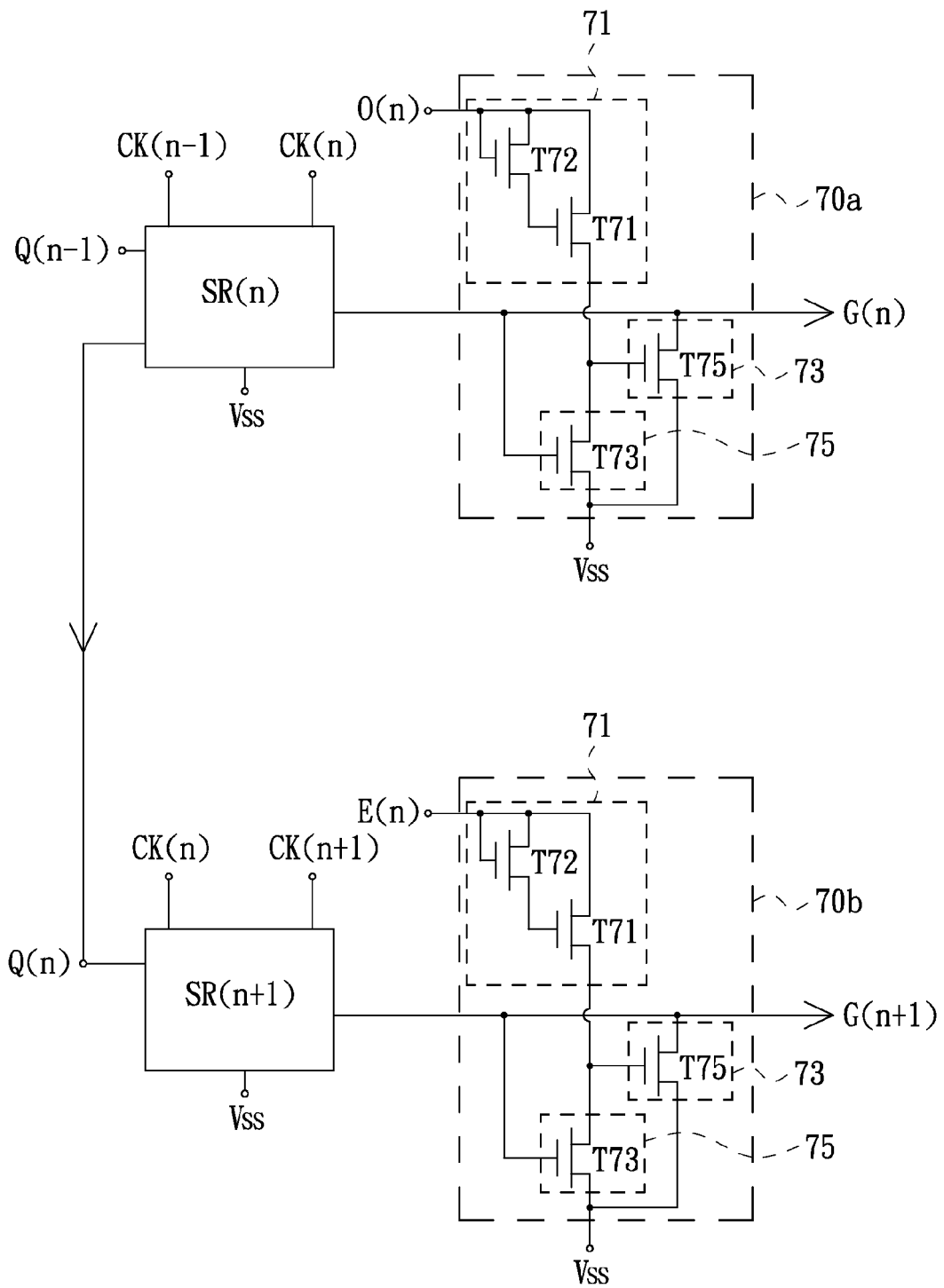
FIG. 8A is a schematic structure view of resetting circuits for adjacent two shift registers in accordance with a fourth embodiment.

Referring to FIG. 8A, a schematic structure view of resetting circuits respectively for adjacent two shift registers in accordance with a fourth embodiment is shown. As depicted in FIG. 8A, an odd-stage shift register SR(n) and an even-stage shift register SR(n+1) adjacent thereto are taken as an example for the purpose of illustration, and the shift registers SR(n), SR(n+1) of FIG. 8A may have the same circuit structure as the shift register SR(n) of FIG. 1, but not to limit the disclosure, that is, the resetting circuits 70a, 70b may be applied to any other well-known shift registers.

The odd-stage shift register SR(n) receives clock signals CK(n−1), CK(n) and a control signal Q(n−1) and is controlled by the control signal Q(n−1) cooperative with the clock signal CK(n−1) to determine whether delivering the clock signal CK(n) to the output terminal of the odd-stage shift register SR(n) to generate a gate driving pulse G(n). The resetting circuit 70a electrically coupled to the output terminal of the odd-stage shift register SR(n) includes a reset driving module 71, a reset module 73 and a reset disabling module 75. In addition, it is noted that, the resetting circuit 70a of FIG. 8A is arranged outside of the odd-stage shift register SR(n), which only is for emphasizing the difference of disclosure with respect to the prior art, but not to limit the resetting circuit 70a whether is included in the odd-stage shift register SR(n) or not.

The reset driving module 71 of the resetting circuit 70a receives an enable signal O(n) and provides the enable signal O(n) to an output terminal of the reset driving module 71. In particular, the reset driving module 71 includes transistors T71, T72. The gate (control terminal) and the drain/source (first terminal) of the transistor T72 receive the enable signal O(n). The gate (control terminal) of the transistor T71 is electrically coupled to the source/drain (second terminal) of the transistor T72, the drain/source (first terminal) of the transistor T71 receives the enable signal O(n), and the source/drain (second terminal) of the transistor T71 serves as the output terminal of the reset driving module 71.

Figure 8B:
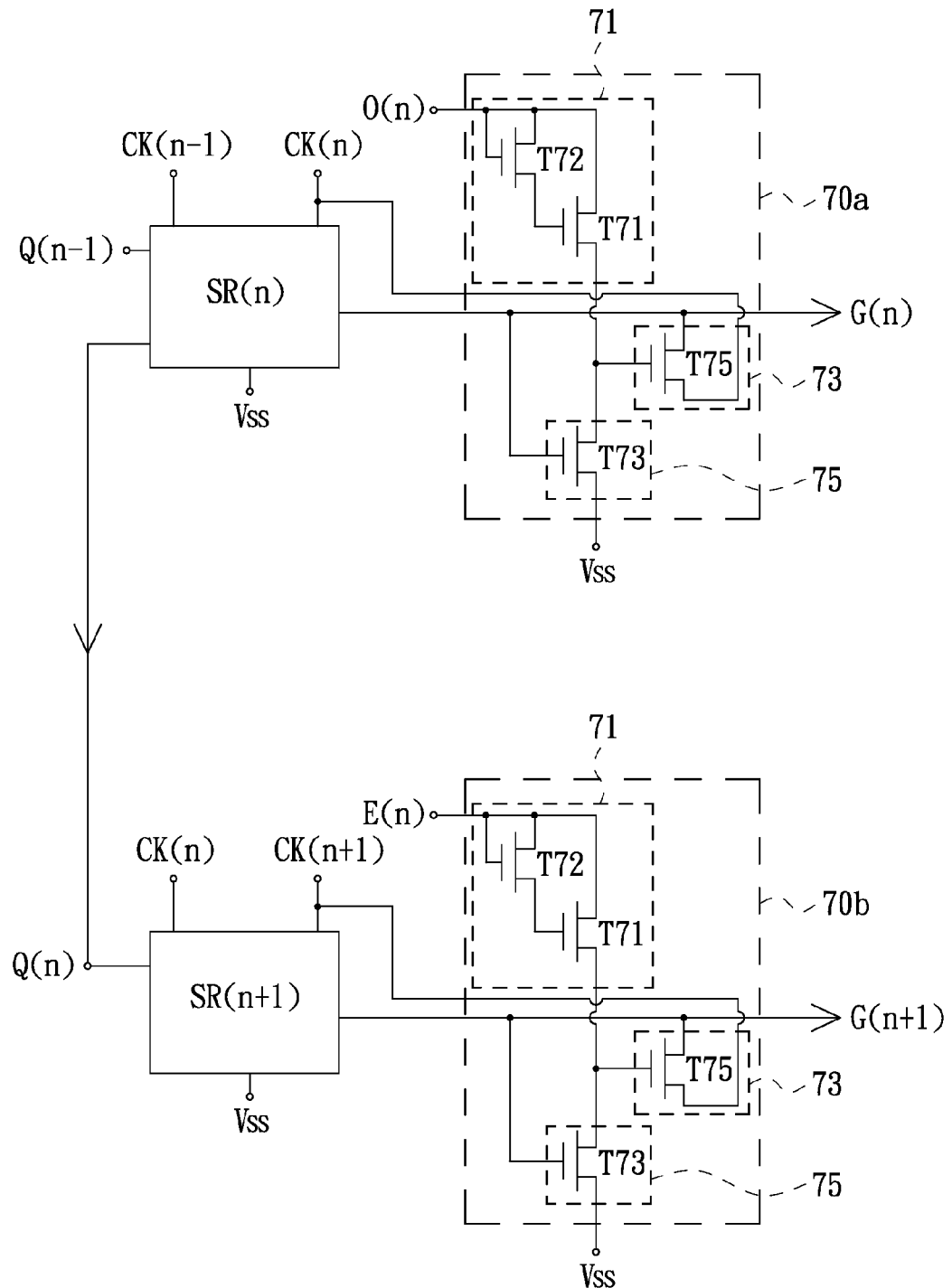
FIG. 8B is a schematic structure view of another resetting circuits for the adjacent two shift registers in accordance with the fourth embodiment.

The reset module 73 in the resetting circuit 70a is electrically coupled to the output terminal of the odd-stage shift register SR(n) and the output terminal of the reset driving module 71 and is controlled by a voltage signal on the output terminal of the reset driving module 71 to determine whether switching on an electrical path between the output terminal of the odd-stage shift register SR(n) and a gate-off voltage level Vss. The reset module 73 includes a transistor T75. The gate (control terminal) of the transistor T75 is electrically coupled to the source/drain of the transistor T71 and is controlled by the voltage on the source/drain of the transistor T71 to determine whether turning on the transistor T75, the drain/source (first terminal) of the transistor T75 is electrically coupled to the output terminal of the odd-stage shift register SR(n), and the source/drain (second terminal) of the transistor T75 is electrically coupled to the gate-off voltage level Vss (first preset voltage). Herein, it is noted that, the source/drain of the transistor T75 is not limited to electrically couple to the gate-off voltage level Vss, and may be electrically coupled to the clock signal CK(n) instead as illustrated in FIG. 8B e.g., for obtaining the logic low level of the clock signal CK(n) delivered in the odd-stage shift register SR(n) as such gate-off voltage level.

The reset disabling module 75 in the resetting circuit 70a is electrically coupled to the output terminal of the odd-stage shift register SR(n) and the output terminal of the reset driving module 71 and is controlled by the voltage signal on the output terminal of the odd-stage shift register SR(n) to determine whether switching on an electrical path between the output terminal of the reset driving module 71 and the gate-off voltage level Vss. Specifically, the reset disabling module 75 includes a transistor T73. The gate (control terminal) of the transistor T73 is electrically coupled to the output terminal of the odd-stage shift register SR(n) and is controlled by the voltage signal on the output terminal of the odd-stage shift register SR(n) to determine whether turning on the transistor T73, the drain/source (first terminal) of the transistor T73 is electrically coupled to the output terminal of the reset driving module 71, and the source/drain (second terminal) of the transistor T73 is electrically coupled to the gate-off voltage level Vss (second preset voltage).

In another aspect, the even-stage shift register SR(n+1) in FIG. 8A receives clock signals CK(n), CK(n+1) and a control signal Q(n) and is controlled by the control signal Q(n) cooperative with the clock signal CK(n) to determine whether delivering the clock signal CK(n+1) to the output terminal of the even-stage shift register SR(n+1) to generate a gate driving pulse G(n+1), and the resetting circuit 70b electrically coupled to the even-stage shift register SR(n+1) has a same circuit structure as the resetting circuit 70a and includes a reset driving module 71, a reset module 73 and a reset disabling module 75. What is difference between the resetting circuits 70a, 70b is that: the resetting circuit 70a uses the enable signal O(n), while the resetting circuit 70b uses another enable signal E(n). In addition, it is noted that, the resetting circuit 70b in FIG. 8A is arranged outside of the even-stage shift register SR(n+1), but not to limit the even-stage shift register SR(n+1) whether includes the resetting circuit 70b therein or not.

Figure 9:
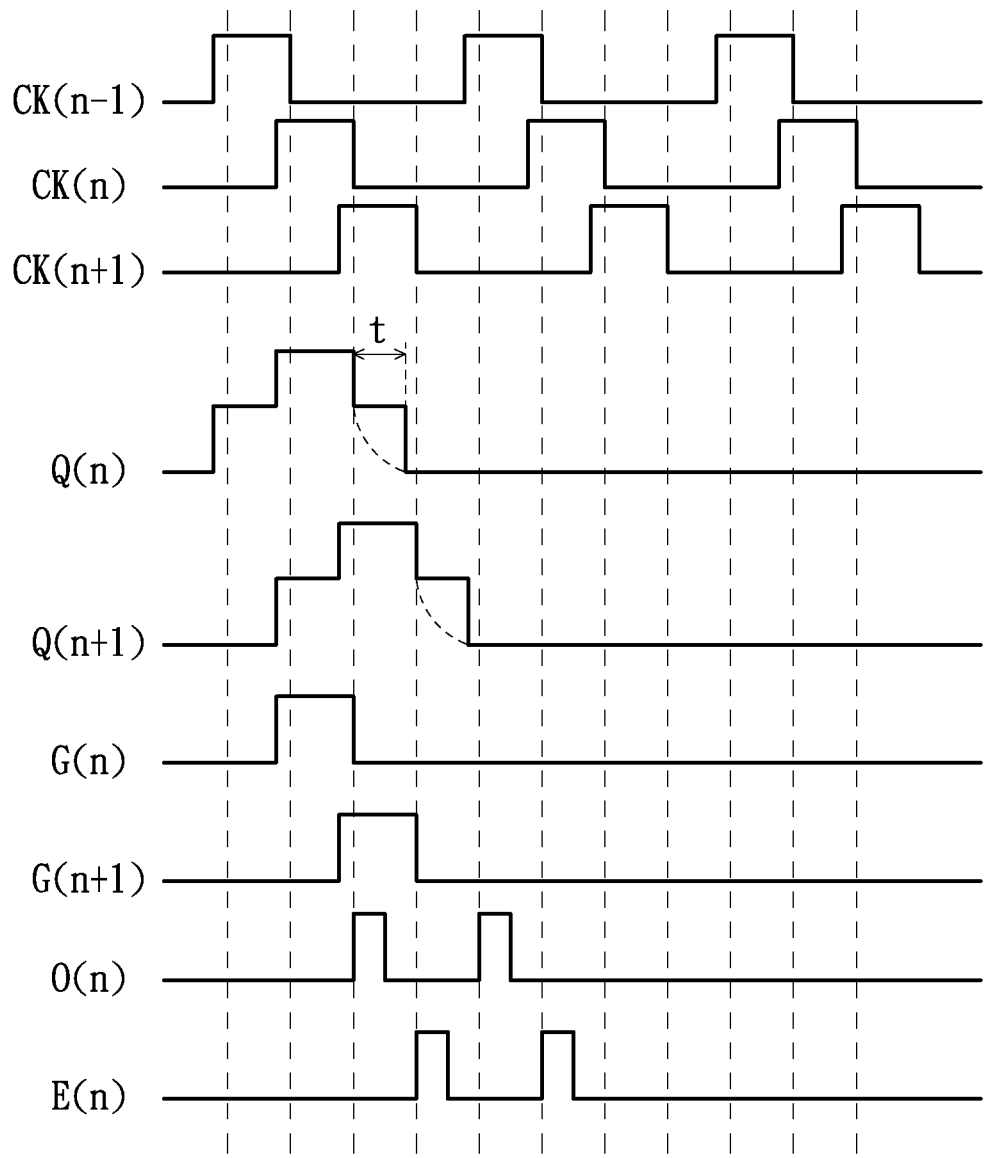
FIG. 9 is a timing diagram of multiple signals associated with the adjacent two shift registers and the resetting circuits as illustrated in FIG. 8A.

FIG. 9 shows a timing diagram of multiple signals associated with the shift registers SR(n), SR(n+1) and the resetting circuits 70a, 70b as illustrated in FIG. 8A, and operation processes of the resetting circuits 70a, 70b will be described below in detail with reference to FIGS. 8A and 9. More specifically, when the clock signal CK(n) is at a logic high level, the clock signal CK(n) is delivered to the output terminal of the odd-stage shift register SR(n) to generate the gate driving pulse G(n) and the control signal Q(n) further is pulled up. At this moment, since the gate driving pulse G(n) is at a logic high level, the transistor T73 of the reset disabling module 75 in the resetting circuit 70a is turned on, the transistor T75 of the reset module 73 in the resetting circuit 70a is turned off, achieving the purpose of reset disabling. Just after the falling edge of the clock signal CK(n), the voltage level of the control signal Q(n) (see Q(n) in the time duration of t as illustrated in FIG. 9) correspondingly is pulled down. At this moment, since the enable signal O(n) is at a logic high level, the transistors T71, T72 of the reset driving module 71 in the resetting circuit 70a are turned on, the logic high level of the enable signal O(n) is delivered to e gate of the transistor T75 of the reset module 73 in the resetting circuit 70a so that the transistor T75 is turned on, the voltage on the output terminal of the odd-stage shift register SR(n) is instantly pulled down to the gate-off voltage level Vss, and meanwhile the transistor T73 of the reset disabling module 75 in the resetting circuit 70a is turned off. Accordingly, even if the control signal Q(n) in the odd-stage shift register SR(n) is leaked to the gate-off voltage level Vss in advance caused by the manufacturing process variation, the gate driving pulse G(n) still can be normally pulled to the gate-off voltage level Vss owing to the resetting effect of the resetting circuit 70a and the tail phenomenon of gate driving pulse is suppressed. As to the operation process of the resetting circuit 70b for the even-stage shift register SR(n+1) is similar to that of the resetting circuit 70a, and thus will be omitted hereby.

Additionally, with regard to the fourth embodiment, when the shift registers SR(n), SR(n+1) are applied to a display device, the timings of the respective enable signals O(n), E(n) can be controlled by a timing controller in the display device, and the enable signals O(n), E(n) start to output logic high levels just after the falling edges of the respective clock signals CK(n), CK(n+1) respectively received by the shift registers SR(n), SR(n+1). Moreover, the times of the enable signals O(n), E(n) staring to output the respective logic high levels can be adjusted by programming, and rather than only are limited to start just after the falling edges of the respective clock signals CK(n), CK(n+1).

Fifth Embodiment

Figure 10A:
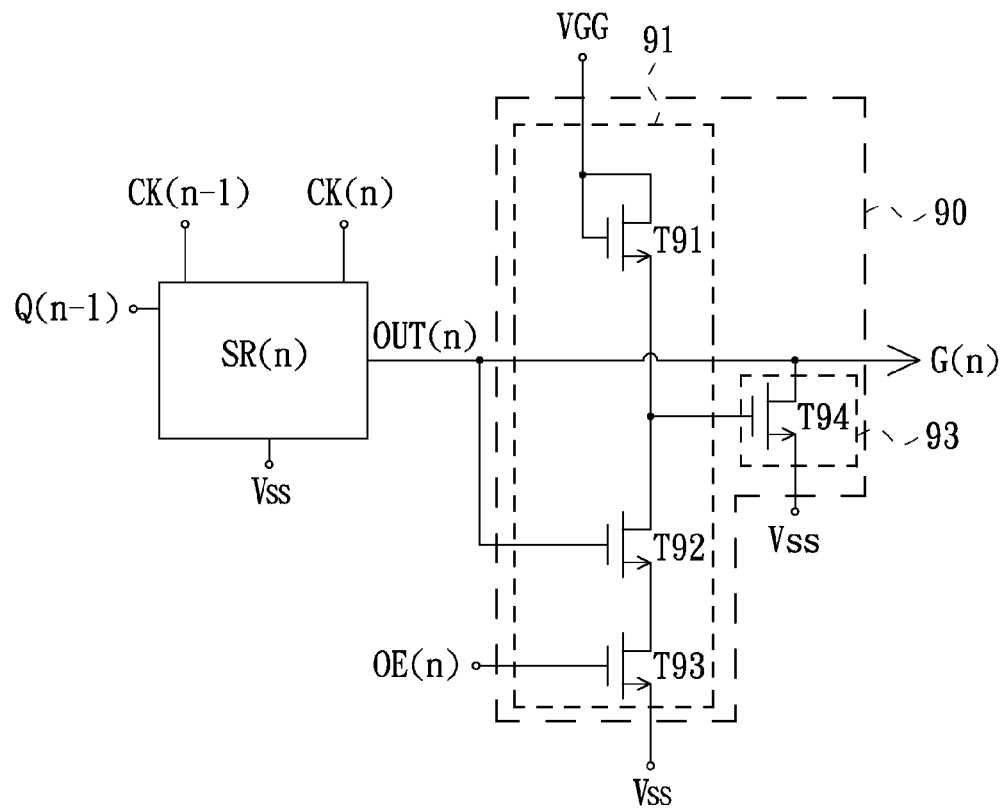
FIG. 10A is a schematic structural view of a resetting circuit in accordance with a fifth embodiment.

Referring to FIG. 10A, FIG. 10A is a schematic structural view of a resetting circuit in accordance with a fifth embodiment. As depicted in FIG. 10A, the resetting circuit 90 is electrically coupled to an output terminal of the shift register SR(n) to regulate a voltage signal OUT(n) on the output terminal of the shift register SR(n). The shift register SR(n) of FIG. 10A may have the same structure as the shift register SR(n) of FIG. 1, but not to limit the disclosure. In addition, it is noted that, the resetting circuit 90 is arranged outside the shift register SR(n), which only is for the purpose of emphasizing the difference of the disclosure with respect to the prior art, but not to limit the shift register SR(n) whether includes the resetting circuit 90 therein or not.

In the fifth embodiment, the shift register SR(n) may be any one stage shift register in multiple cascade-connected shift registers. The shift register SR(n) receives clock signals CK(n−1), CK(n) and a control signal Q(n−1) and is controlled by the control signal Q(n−1) cooperative with the clock signal CK(n−1) to determine whether deliver the clock signal CK(n) to the output terminal of the shift register SR(n) so as to output the voltage signal OUT(n). Herein, the control signal Q(n−1) is the signal at the node Q of the firstly-preceding shift register (not shown). The resetting circuit 90 is electrically coupled to the output terminal of the shift register SR(n). In the fifth embodiment, the resetting circuit 90 includes a reset driving module 91 and a reset module 93. The reset driving module 90 receives an enable signal OE(n) to output a control voltage signal at the output terminal thereof to the reset module 93.

In particular, the reset driving module 91 is electrically coupled to a power supply voltage VGG and a preset voltage e.g., gate-off voltage level (second preset voltage) and receives the enable signal OE(n) and the output voltage signal OUT(n) of the shift register SR(n). As illustrated, the reset driving module 91 includes transistors T91, T92 and T93. The gate (control terminal) and the drain/source (first terminal) of the transistor T91 both receive the power supply voltage VGG, and the source/drain (second terminal) of the transistor T91 is electrically coupled to the output terminal of the reset driving module T91. The gate (control terminal) of the transistor T92 is electrically coupled to the output terminal of the shift register SR(n) to receive the voltage signal OUT(n), and the drain/source (first terminal) of the transistor T92 is electrically coupled to the source/drain of the transistor T91. The gate (control terminal) of the transistor T93 receives the enable signal OE(n), the drain/source (first terminal) of the transistor T93 is electrically coupled to the source/drain (second terminal) of the transistor T92, and the source/drain (second terminal) of the transistor T93 is electrically coupled to the gate-off voltage level Vss.

The reset module 93 is electrically coupled to the output terminal of the shift register SR(n) and the output terminal of the reset driving module 91, and is controlled by a control voltage signal outputted from the output terminal of the reset driving module 91 to determine whether switching on the electrical path between the output terminal of the shift register SR(n) and the gate-off voltage level Vss. More specifically, the reset module 93 includes a transistor T94. The gate (control terminal) of the transistor T94 is electrically coupled to the source/drain of the transistor T91 (i.e., the output terminal of the reset driving module 91) and is controlled by a control voltage signal on the source/drain of the transistor T91 to determine whether turning on the transistor T94, the drain/source (first terminal) of the transistor T94 is electrically coupled to the output terminal of the shift register SR(n), and the source/drain (second terminal) of the transistor T94 is electrically coupled to the gate-off voltage level Vss (first preset voltage).

As seen from FIG. 10A, during the resetting circuit 90 is in operation, when the OUT(n) and OE(n) both are logic high, the transistors T92, T93 in the reset driving module 91 are turned on, so that the transistor T94 in the reset module 93 is turned off due to the control voltage signal on the gate of the transistor T94 is logic low, the gate driving pulse G(n) is the same as the OUT(n), i.e., is logic high. Whereas, when any one or both of the OUT(n) and OE(n) is/are logic low, at least one of the transistors T92, T93 in the reset driving module 91 is turned off, so that the transistor T94 in the reset module 93 is turned on due to the control voltage signal on the gate of the transistor T94 is logic high, the OUT(n) is pulled down to the gate-off voltage level Vss so that the regulated gate driving pulse G(n) becomes logic low. As a result, the gate driving pulse G(n) can normally discharge to the gate-off voltage level Vss owing to the resetting effect of the resetting circuit 90 and thus is without the occurrence of tail phenomenon. Herein, when the shift register SR(n) in accordance with the fifth embodiment is applied to a display device, the timing of the enable signal OE(n) can be controlled by a timing controller of the display device.

Figure 10B:
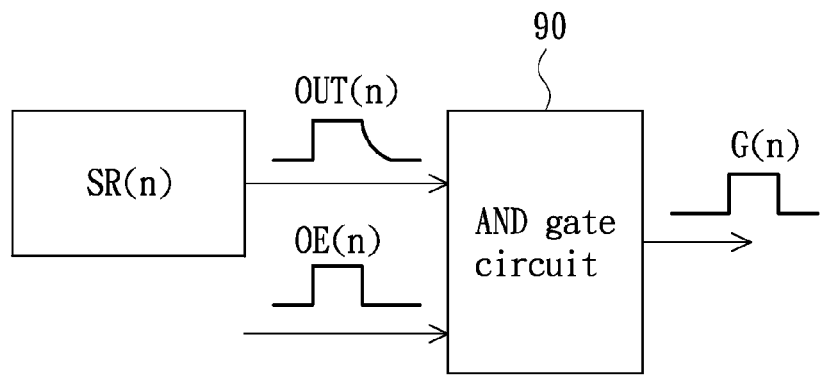
FIG. 10B is a schematic functional block diagram of the resetting circuit in FIG. 10A.

It is found from the above described operation process that the resetting circuit 90 functions as an ANG gate circuit, for example the illustration of FIG. 10B. In other words, in the fifth embodiment, an AND gate circuit is adopted as the resetting circuit to improve the tail phenomenon in the prior art. It is noted that, the detailed circuit structure of the resetting circuit 90 illustrated in FIG. 10A only is one exemplary embodiment of the AND gate circuit, it is not to limit the detailed circuit structure of the AND gate circuit of the disclosure.

Sum up, in the various embodiments of disclosure, a specific resetting circuit is provided to regulate the voltage on the output terminal of the shift register, e.g., instantly turn off the output of the shift register in a particular time duration, so that the performance of the shift register is improved, the shift register still can normally output the gate driving pulse even if there is a manufacturing process variation, and the tail phenomenon of gate driving pulse is suppressed consequently.

While the disclosure has been described in terms of what is presently considered to be the most practical and preferred embodiments, it is to be understood that the disclosure needs not be limited to the above exemplary embodiments. On the contrary, it is intended to cover various modifications and similar arrangements included within the spirit and scope of the appended claims which are to be accorded with the broadest interpretation so as to encompass all such modifications and similar structures.

What is claimed is:

1. A resetting circuit adapted to regulate a voltage on an output terminal of a shift register, the resetting circuit comprising:
   a reset driving module, being received with an enable signal to output a control voltage signal at an output terminal of the reset driving module; and
   a reset module, electrically coupled to the output terminal of the shift register and the output terminal of the reset driving module and being controlled by the control voltage signal on the output terminal of the reset driving module to turn on or off an electrical path between the output terminal of the shift register and a first preset voltage;
   wherein the reset circuit further comprises:
   a reset disabling module, electrically coupled to the output terminal of the shift register and the output terminal of the reset driving module and being controlled by the voltage on the output terminal of the shift register to turn on or off an electrical path between the output terminal of the reset driving module and a second preset voltage.

2. The resetting circuit as claimed in claim 1, wherein the certain one stage shift register is an odd-stage shift register in the cascade-connected shift registers, and the reset control signal is a signal in the firstly-succeeding odd-stage shift register for controlling a received clock signal whether to be delivered to an output terminal of the firstly-succeeding odd-stage shift register.

3. The resetting circuit as claimed in claim 2, wherein the reset module comprises:
   a second transistor comprising
      a control terminal, electrically coupled to the second terminal of the first transistor and being controlled by the voltage on the second terminal of the first transistor to determine whether turning on the second transistor;
      a first terminal, electrically coupled to the output terminal of the odd-stage shift register; and
      a second terminal, electrically coupled to the first preset voltage.

4. The resetting circuit as claimed in claim 1, wherein the certain one stage shift register is an even-stage shift register in the cascade-connected shift registers, and the reset control signal is a signal provided from an output terminal of the firstly-succeeding stage shift register of the even-stage shift register.

5. The resetting circuit as claimed in claim 4, wherein the reset module comprises:
   a second transistor comprising:
      a control terminal, electrically coupled to the second terminal of the first transistor and being controlled by the voltage on the second terminal of the first transistor to determine whether turning on the second transistor;
      a first terminal, electrically coupled to the output terminal of the even-stage shift register; and
      a second terminal, electrically coupled to the first preset voltage,
   wherein the even-stage shift register determines whether to deliver a received clock signal to the output terminal of the even-stage shift register according to an output signal of the firstly-preceding stage shift register of the even-stage shift register, and the first preset voltage is a voltage level of the received clock signal delivered into the even-stage shift register.

6. The resetting circuit as claimed in claim 1, wherein the reset driving module comprises:
   a first transistor comprising a control terminal, a first terminal and a second terminal, wherein the control terminal and the first terminal of the first transistor are received with the enable signal; and
   a second transistor comprising a control terminal, a first terminal and a second terminal, wherein the control terminal of the second transistor is electrically coupled to the second terminal of the first transistor, the first terminal of the second transistor is received with the enable signal, and the second terminal of the second transistor serves as the output terminal of the reset driving module.

7. The resetting circuit as claimed in claim 1, wherein the reset disabling module comprises:
   a transistor comprising:
      a control terminal, electrically coupled to the output terminal of the shift register and being controlled by the voltage on the output terminal of the shift register to turn on or off the transistor;
      a first terminal, electrically coupled to the output terminal of the reset driving module; and
      a second terminal, electrically coupled to the second preset voltage.

8. The resetting circuit as claimed in claim 1, wherein the reset module comprises:
   a transistor comprising:
      a control terminal, electrically coupled to the output terminal of the reset driving module and being controlled by the voltage on the output terminal of the reset driving module to turn on or off the transistor;
      a first terminal, electrically coupled to the output terminal of the shift register; and
      a second terminal, electrically coupled to the first preset voltage.

9. The resetting circuit as claimed in claim 8, wherein the first preset voltage is the same as the second preset voltage.

10. The resetting circuit as claimed in claim 8, wherein the shift register is controlled by an output signal of the firstly-preceding stage shift register to determine whether delivering a received clock signal to the output terminal of the shift register, and the first preset voltage is a voltage level of the received clock signal delivered into the shift register.

11. The resetting circuit as claimed in claim 1, wherein the reset driving module further is received with a voltage signal on the output terminal of the shift register, the reset driving module and the reset module cooperatively constitute an AND gate circuit to perform a logic AND operation to the enable signal and the voltage signal on the output terminal of the shift register.

12. The resetting circuit as claimed in claim 1, wherein the reset driving module comprises:
   a first transistor, a control terminal and a first terminal of the first transistor both being received with a power supply voltage, and a second terminal of the first transistor being electrically coupled to the output terminal of the reset driving module;
   a second transistor, a control terminal of the second transistor being electrically coupled to the output terminal of the shift register, and a first terminal of the second transistor a third transistor, a control terminal of the third transistor being received with the enable signal, a first terminal of the third transistor being electrically coupled to a second terminal of the second transistor, and a second terminal of the third transistor being received with a second preset voltage.

13. The resetting circuit as claimed in claim 12, wherein the reset module comprises:

a fourth transistor, a control terminal of the fourth transistor being electrically coupled to the output terminal of the reset driving module, a first terminal of the fourth transistor being electrically coupled to the output terminal of the shift register, and a second terminal of the fourth transistor being received with the first preset voltage.

14. A resetting circuit adapted to regulate a voltage on an output terminal of a shift register, the resetting circuit comprising:

a reset driving module, being received with an enable signal to output a control voltage signal at an output terminal of the reset driving module; and a reset module, electrically coupled to the output terminal of the shift register and the output terminal of the reset driving module and being controlled by the control voltage signal on the output terminal of the reset driving module to turn on or off an electrical path between the output terminal of the shift register and a first preset voltage, wherein the shift register is a certain one stage shift register in a plurality of cascade-connected shift registers, and the reset driving module comprises:

a first transistor comprising:

a control terminal, being received with a reset control signal and controlled by the reset control signal to turn on or off the first transistor;

a first terminal, being received with the enable signal; and a second terminal, serving as the output terminal of the reset driving module.

\* \* \* \* \*